(12) United States Patent
Mitamura

(10) Patent No.: US 6,291,760 B1
(45) Date of Patent: Sep. 18, 2001

(54) THERMOELECTRONIC GENERATING ELECTRONIC DEVICE

(75) Inventor: Gen Mitamura, Chiba (JP)

(73) Assignee: Seiko Instruments Inc. (JP)

(*) Notice: Subject to any disclaimer, the term of this patent is extended or adjusted under 35 U.S.C. 154(b) by 0 days.

(21) Appl. No.: 09/439,829

(22) Filed: Nov. 12, 1999

(30) Foreign Application Priority Data

Nov. 13, 1998 (JP) .................................................. 10-323825

(51) Int. Cl.$^7$ .................................................. H01L 35/30

(52) U.S. Cl. .......................................... 136/205; 136/242

(58) Field of Search .................................... 136/205, 242

(56) References Cited

FOREIGN PATENT DOCUMENTS

| | | |
|---|---|---|
| 613087 | 9/1979 | (AT) . |
| 837377A1 | 4/1998 | (EP) . |
| 2310589 | 5/1976 | (FR) . |
| 1520193 | 8/1978 | (GB) . |
| 2020863 | 11/1979 | (GB) . |

OTHER PUBLICATIONS

Patent Abstracts of Japan, vol. 1998, No. 09 Jul. 31, 1998 & JP 10 111368, Apr. 28, 1998.
Patent Abstracts of Japan, vol. 018, No. 387 Jul. 20, 1994 & JP 06 109868, Apr. 22, 1994.
European Search Report, Feb. 3, 2000.

*Primary Examiner*—Kathryn Gorgos
*Assistant Examiner*—Thomas H Parsons
(74) *Attorney, Agent, or Firm*—Adams & Wilks

(57) ABSTRACT

A thermoelectric generating electronic device has a heat insulating drum with a hollow portion extending in a vertical direction, a rear cover covering a lower end side of the hollow portion, a glass on an upper end side of the hollow portion, a bezel connected to the heat insulating drum, and a heat radiating drum thermally connected with the bezel. A thermoelectric generator has a heat receiving portion and a heat radiating portion for generating electric energy in accordance with a temperature difference between the heat receiving portion and the heat radiating portion. The heat radiating portion is thermally connected to the bezel and the heat receiving portion is thermally connected to the rear cover. A heat accumulating material is disposed generally parallel to the thermoelectric generator for accumulating heat and in the hollow portion, so that heat is conducted to the heat receiving portion.

18 Claims, 9 Drawing Sheets

THERMOELECTRONIC GENERATING ELECTRONIC DEVICE

BACKGROUND OF THE INVENTION

1. Field of the Invention

The present invention relates to a thermoelectric generating electronic device such as a wrist watch, etc., an electronic device such as a table clock, a wall clock, a page, etc. Having a thermoelectric generator.

2. Description of the Related Art

The main current of a thermoelectric generating electronic device, e.g., a wrist watch is now an electronic type wrist watch. A silver oxide battery, a lithium battery, etc. Are used as a power source of this electronic wrist watch.

However, these batteries are articles of consumption so that periodic exchange is required and limited resources of the earth are consumed.

Therefore, a wrist watch having an electricity generating mechanism therein instead of these batteries is researched.

For example, a solar battery for converting optical energy, mechanical electricity generation utilizing gravitational energy, or thermoelectric generation utilizing the Seebeck effect based on a temperature difference, etc. are known as an electricity generating system of this wrist watch having the electricity generating mechanism therein. Wrist watches using the solar battery and the mechanical electricity generation among these electricity generating systems are already used practically.

When a thermoelectricity generating system is utilized, the thermoelectric generating electronic device utilizes the difference between a body temperature (a high temperature portion) transmitted to the thermoelectric generating electronic device through an arm and a temperature of the outside air (a low temperature portion) around the thermoelectric generating electronic device.

However, the conventional thermoelectric generating electronic device has problems in thermal conductivity from the high temperature portion to a heat receiving portion of a thermoelectric generator, thermal conductivity from a heat radiating portion of the thermoelectric generator to the low temperature portion, etc. Further, a problem exists in that the above temperature difference sufficient to generate required electric energy by the thermoelectric generator cannot be obtained.

In particular, after the thermoelectric generating electronic device is mounted to an arm, a rear cover of the thermoelectric generating electronic device is rapidly warmed by the body temperature for some time. In contrast to this, a drum or a bezel of the thermoelectric generating electronic device is cold. Therefore, the temperature difference between the heat receiving portion and the heat radiating portion of the thermoelectric generator is large. However, the bezel gradually rises in temperature by thermal conductivity so that the temperature difference is gradually reduced.

When the thermoelectric generating electronic device is detached from the arm, the heat receiving portion and the heat radiating portion of the thermoelectric generator are approximately simultaneously cooled by heat radiation so that the temperature difference becomes small. Therefore, a problem exists in that no thermoelectric generator can almost generate electric energy.

SUMMARY OF THE INVENTION

To solve the above problems, the present invention is constructed such that a heat radiating portion is connected to a bezel in a heat conductible state and a heat receiving portion is connected to a rear cover in a heat conductible state; and a first heat accumulating material is arranged in the heat receiving portion of the thermoelectric generator in a heat conductible state.

In accordance with the present invention, the heat radiating portion of the thermoelectric generator is connected to the bezel in a heat conductible state and the heat receiving portion is connected to the rear cover in a heat conductible state. Further, a first heat accumulating material is arranged in the rear cover parallel with the thermoelectric generator in a heat conductible state. Therefore, heat from an arm is conducted to the heat receiving portion of the thermoelectric accumulating material. The heat passing through the thermoelectric geerator is further radiated from the heat radiating portion to the outside air through the bezel, a glass and a heat radiating drum. In contrast to this, the heat flowing to the first heat accumulating material warms this heat accumulating material and is accumulated as latent heat until a melting point (solidifying point) temperature is reached. When the temperature of the first heat accumulating material exceeds the melting point, phases of the first heat accumulating material are changed from a solid phase to a liquid phase and the first heat accumulating material rises in temperature. Thus, the temperature difference between the first heat accumulating material and the heat receiving portion of the thermoelectric generator is vanished so that the temperature of the first heat accumulating material is set to a constant temperature. A thin plate of stainless steel and titanium having low thermal conductivity is used in the rear cover. Accordingly, heat is easily conducted to the thin plate in its thickness direction and electricity is generated immediately after the thermoelectric generating electronic device is mounted to the arm. In contrast to this, no heat is easily conducted in a diametrical direction so that no thermoelectric generating electronic device is influenced by a reduction in temperature due to the heat accumulating material. Accordingly, a temperature difference equal to that in an unarranging case of the first heat accumulating material is caused between the heat receiving portion and the heat radiating portion of the thermoelectric generator. Thus, the thermoelectric generator can generate predetermined electric energy.

Further, a predetermined quantity of heat is accumulated to the first heat accumulating material.

Accordingly, electricity is continuously generated by the predetermined quantity of heat accumulated in the first heat accumulating material even when the above thermoelectric generating electronic device is detached from the arm.

When the thermoelectric generating electronic device is detached from the arm, the temperature of the rear cover begins to be reduced as well as the glass, the bezel and the heat radiating drum by radiating heat to. the outside air. Heat capacities of the glass, the bezel and the heat radiating drum are normally greater than the heat capacity of the rear cover. Accordingly, the rear cover is cooled fast in comparison with the glass, the bezel and the heat radiating drum so that an electricity generating amount is reduced and becomes zero. In a short time, the temperature of the heat receiving portion of the thermoelectric generator is conversely lower than that of the heat radiating portion so that counter electromotive force is caused. There is a means in which the counter electromotive force is inverted by an electric circuit and is utilized as electromotive force. However, no counter electromotive force is utilized since there is no large effect in consideration of electric power consumed for this means. In accordance with the present invention, the first heat accumulating material is arranged in a state in which heat can be conducted to the rear cover. Stainless steel and titanium having low thermal conductivity are used in the rear cover, However, heat is greatly conducted to the rear cover in comparison with heat radiated from the rear cover to the outside air. Accordingly, while the above entire thermoelectric generating electronic device is cooled, electricity generation is maintained although efficiency is low while the rear cover is maintained at a high temperature in comparison with the glass, the bezel and the heat radiating drum. When the above entire thermoelectric generating electronic device is further cooled and falls in temperature until a solidifying point of the first heat accumulating material, this heat accumulating material discharges latent heat so that a constant temperature is held and the rear cover is held at the constant temperature. Accordingly, the heat receiving portion of the generator thermally connected to the rear cover is also maintained constantly at the solidifying point temperature. In contrast to this, since the bezel is continuously cooled, the difference in temperature between the bezel and the heat radiating portion is gradually increased so that an electricity generating amount is increased. In a short time, when the temperature of the bezel is equal to the temperature of the outside air, electricity generating force becomes maximal and is maintained until the above heat accumulating material discharges the latent heat. Thereafter, the temperature of this heat accumulating material gradually falls and soon becomes the temperature of the outside air and the electricity generation is stopped. In the meantime, there is no reverse conversion of polarities of the electromotive force seen above and thermal energy can be effectively converted to electric energy.

Further, for example, when the temperature of the outside air is changed from a temperature lower than the above predetermined temperature to a high temperature, or is changed from a temperature higher than the above predetermined temperature to a low temperature in a state in which the above thermoelectric generating electronic device is not mounted to the arm, the first heat accumulating material absorbs or discharges heat from the heat receiving portion so that the heat receiving portion can be held at the above predetermined temperature for a constant time. Namely, when no thermoelectric generating electronic device is mounted to the arm, a change in temperature on one side is delayed in time by the heat accumulating material if there is a change in the temperature of the outside air. Thus, the electric energy can be obtained by causing the temperature difference between the heat receiving portion and the heat radiating portion.

Here, for example, the thermoelectric generating electronic device is constructed by an electronic device such as a wrist watch, a table clock, a wall clock, a page, etc.

Further, for example, a material having low thermal conductivity is constructed by ceramics, plastic, or a metal such as stainless steel, titanium alloy, etc.

For example, the heat accumulating material is constructed by a substance of a paraffin system, etc. in which phases of this substance are changed from a liquid phase to a solid phase near a room temperature and a body temperature.

Further, in another invention, a thermoelectric generator is constructed such that a heat radiating portion is connected to a bezel in a heat conductible state and a heat receiving portion is connected to a rear cover in a heat conductible state, and a second heat accumulating material is arranged in a state in which heat can be conducted to a heat radiating portion.

In accordance with this invention, the heat radiating portion of the thermoelectric generator is connected to the bezel in a heat conductible state and the heat receiving portion is connected to the rear cover in a heat conductible state. The second heat accumulating material is arranged in the above wrist watch in a state in which heat can be conducted to the heat radiating portion. Therefore, heat from an arm is conducted to the heat receiving portion of the thermoelectric generator through the rear cover. In contrast to this, heat from the heat radiating portion of the thermoelectric generator is conducted to the second heat accumulating material and is radiated to the exterior through the bezel.

Accordingly, a temperature difference is caused between the heat receiving portion and the heat radiating portion of the thermoelectric generator. The thermoelectric generator can generate predetermined electric energy on the basis of this temperature difference.

The heat emitted from the heat radiating portion of the thermoelectric generator is radiated to the outside air through the bezel, the glass and the heat radiating drum. However, resistance is large in the heat radiation to the air so that the heat radiation is gradually saturated. Then, the temperature of the bezel gradually rises and the temperature difference between the heat radiating portion and the heat receiving portion is reduced so that electricity generating ability is reduced.

However, in accordance with the construction of the present invention, the second heat accumulating material is arranged in parallel with the generator. Therefore, a predetermined quantity of heat of the heat radiating portion is absorbed to this second heat accumulating material. This heat is continuously absorbed to this second heat accumulating material until phases of the second heat accumulating material are soon changed from a solid phase to a liquid phase and the temperature of the second heat accumulating material is equal to that of the bezel. Accordingly, the predetermined quantity of heat is absorbed to the second heat accumulating material for some time after the above thermoelectric generating electronic device is mounted to the arm. Therefore, the temperature of the heat radiating portion connected to the second heat accumulating material in a heat conductible state can be held at a predetermined temperature for a constant time. Namely, the temperature difference between the heat receiving portion and the heat radiating portion is enlarged and more electric energy can be obtained.

For example, after the above thermoelectric generating electronic device is detached from the arm, the heat radiating portion connected to the second heat accumulating material in a heat conductible state can be held at the predetermined temperature for a constant time by the predetermined quantity of heat accumulated to the second heat accumulating material. Namely, a minus temperature difference is generated between the heat receiving portion and the heat radiating portion. The minus electromotive force is reversely converted by an electronic circuit so that electric energy for operating the thermoelectric generating electronic device can be obtained.

Further, when the above thermoelectric generating electronic device is stored in a state in which no thermoelectric generating electronic device is mounted to the arm, there is a change in room temperature if the thermoelectric generating electronic device is left in an environment in which no heat is insulated. For example, there is a considerable change in temperature during one day in a daily life such as daytime and night, operating and stopping times of air conditioners, or existence or nonexistence of solar radiation, entrance and exit of men, etc. When there is no heat accumulating material, the rear cover and the bezel simultaneously follow the change in environmental temperature. Therefore, no temperature change is caused between the bezel and the rear cover. However, a time difference is caused in the temperature change by arranging the heat accumulating material so that a temperature difference is caused. When the temperature of the outside air is changed from a temperature lower than the above predetermined temperature to a high temperature, or is changed from a temperature higher than the above predetermined temperature to a low temperature, the second heat accumulating material absorbs or discharges heat from the heat radiating portion so that the heat radiating portion can be held at the above predetermined temperature for a constant time. Namely, electric energy can be obtained by causing the temperature difference between the heat receiving portion and the heat radiating portion.

Further, if first and second heat insulating materials are combined and simultaneously arranged, the temperature change can further effectively cause the temperature difference by the time difference.

Further, in the present invention, there is a contrivance in the selection of a material of the rear cover. In this contrivance, the rear cover is formed by a material of low thermal conductivity such as a thin plate of stainless steel and titanium of about 20 W/m/°C. in thermal conductivity. The thermal type generator is fixedly attached to a central portion of the rear cover, and the first heat accumulating material is fixedly attached to an edge portion of the rear cover so that heat from the arm is absorbed in parallel. The heat accumulating material be also arranged at the center of the rear cover and the generator can be also arranged in the edge portion of the rear cover.

In accordance with the present invention, since the rear cover is formed by the material of low thermal conductivity, no heat is easily transmitted in a diametrical direction of a long distance so that no generator is influenced by a reduction in temperature due to the heat accumulating material. In contrast to this, the rear cover is thin in a thickness direction so that heat is easily transmitted in the plate thickness direction. Accordingly, electricity can be generated immediately after the thermoelectric generating electronic device is attached to the arm.

A heat conducting plate of high thermal conductivity such as copper, aluminum, etc. having thermal conductivity greater than 200 W/m/°C. is arranged in connection of the bezel and the heat radiating portion of the thermoelectric generator. The above second heat accumulating material is fixedly attached to the above heat conducting plate.

In accordance with the present invention, the bezel and the heat radiating portion of the thermoelectric generator are joined to each other through the heat conducting plate of high thermal conductivity. Further, the second heat accumulating material is fixedly attached to this heat conducting plate. Therefore, heat from the heat radiating portion of the thermoelectric generator is easily conducted to the second heat accumulating material.

Therefore, the heat from the heat radiating portion of the thermoelectric generator is almost first absorbed to the second heat accumulating material so that a rise in temperature of the heat radiating portion can be delayed.

BRIEF DESCRIPTION OF THE DRAWINGS

A preferred form of the present invention is illustrated in the accompanying drawings in which.

DETAILED DESCRIPTION OF THE PREFERRED EMBODIMENTS

Each of embodiment mode examples of a thermoelectric generating electronic device in the present invention will next be described with reference to the drawings.

First Embodiment Mode Example

Figure 1:
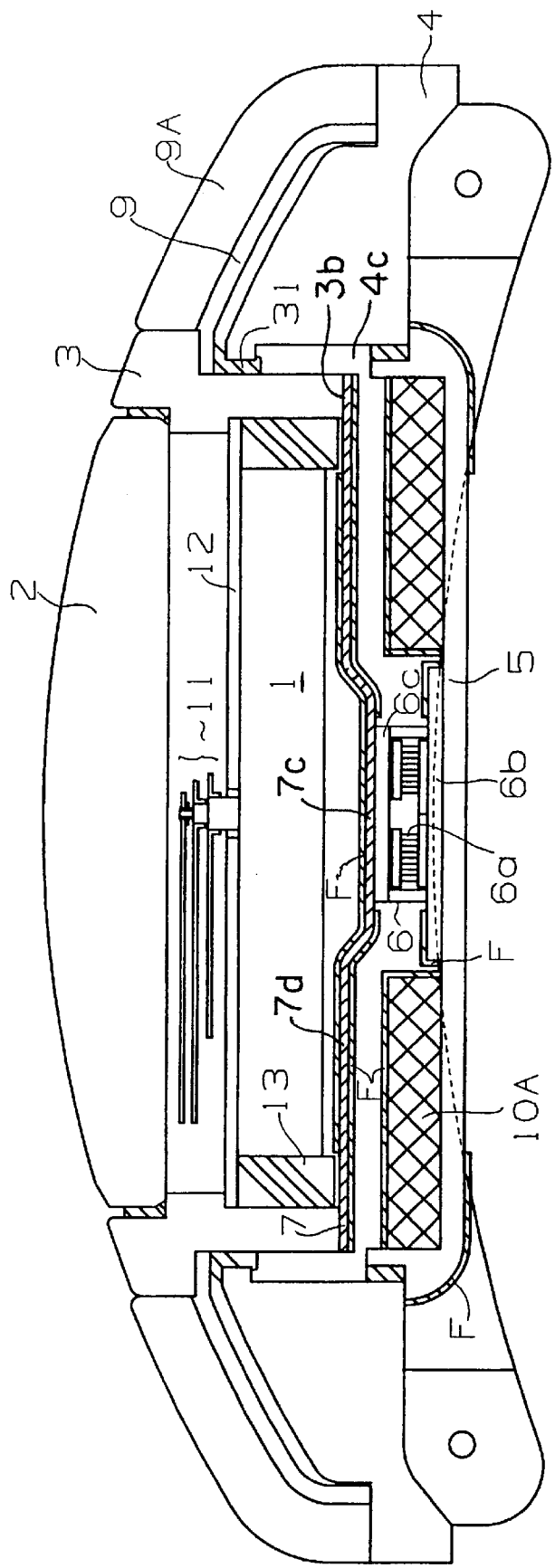
FIG. 1 is a cross-sectional view of a wrist watch illustrated as a first embodiment mode example of a thermoelectric generating electronic device in the present invention.
Figure 2:
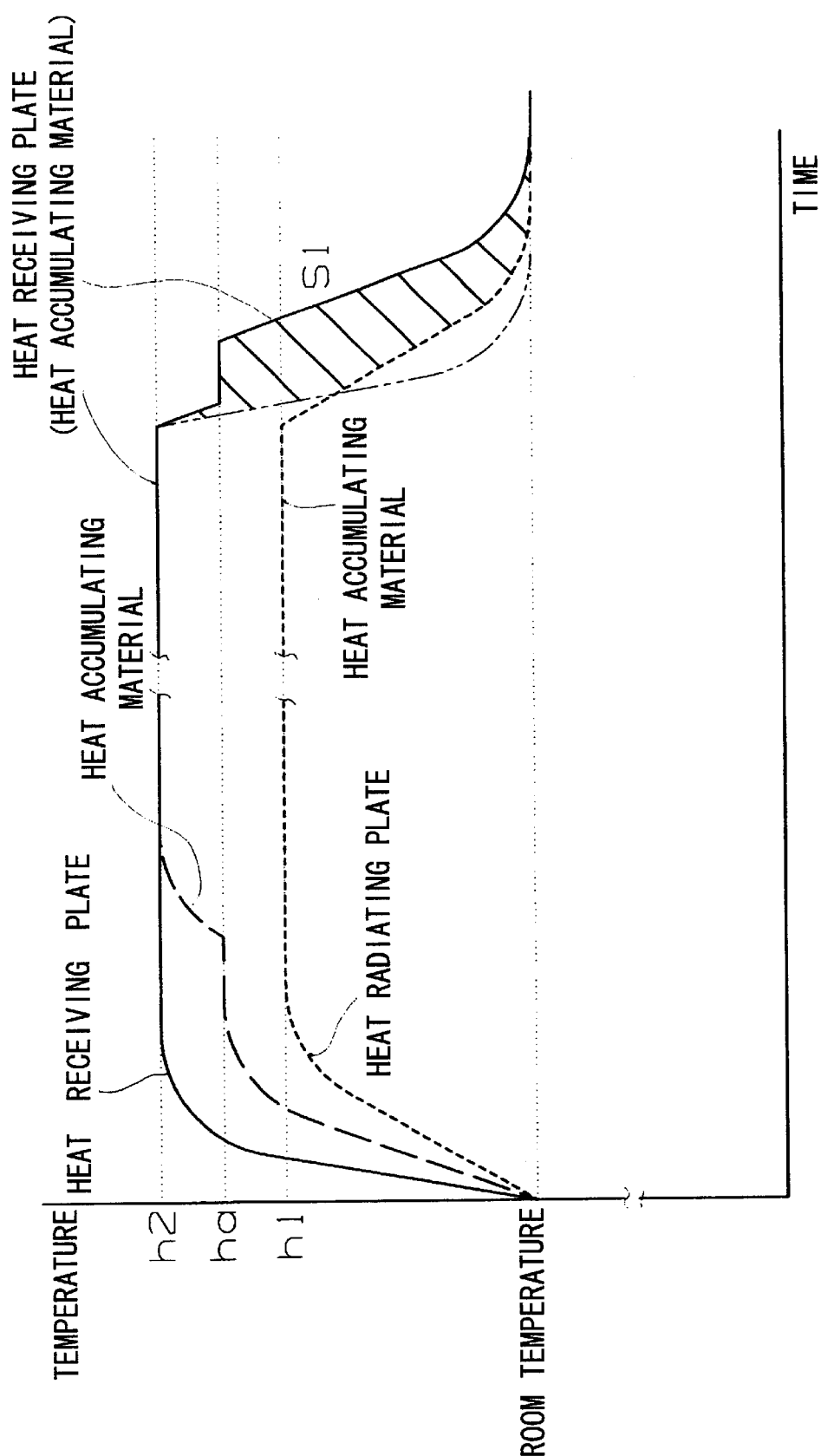
FIG. 2 is a graph showing changes in temperatures of a heat radiating portion and a heat receiving portion of a thermoelectric generator arranged in the wrist watch of FIG. 1.

FIG. 1 is a cross-sectional view of a wrist watch illustrated as a first embodiment mode example of the thermoelectric generating electronic device in the present invention. FIG. 2 is a graph showing changes in temperatures of a heat radiating portion and a heat receiving portion of a thermoelectric generator arranged in the wrist watch of FIG. 1.

In FIG. 1, reference numeral 1 denotes a movement; 2, a glass; 3, a bezel; 4, a first frame or heat insulating drum comprise of a heat insulating material; 5, a rear cover; 6, a thermoelectric generator; 7, a heat conducting plate; 9, a second frame or heat radiating drum for radiating heat; 10A, a heat accumulating material (a first heat accumulating material); 11, a hand; 12, a character board; 13, a middle frame; 31, a packing; F, a heat insulating material; and 9A, a heat radiating fin.

The thermoelectric generator 6 is constructed by plural (e.g., twelve) thermoelectricity generating elements 6a- - - , and a heat radiating portion 6c and a heat receiving portion 6b for nipping and supporting these thermoelectricity generating elements 6a- - - from above and below.

This thermoelectric generator 6 generates predetermined electric energy by the Seebeck effect by utilizing the difference in temperature between the heat receiving portion 6b (a high temperature portion) and the heat radiating portion (a low temperature portion).

In this thermoelectric generator 6, a side end face of the heat receiving portion 6b is fixedly attached to a central portion of the rear cover 5 and a side end face of the heat radiating portion 6c is fixedly attached to the heat conducting plate 7 having a resilient property.

The heat receiving portion 6b of the thermoelectric generator 6 is formed in a state extending from an outside face of this generator to improve a collecting function of heat from the rear cover 5. A face which is exposed to a storing space 4c (described later) is coated with a heat insulating material F to prevent heat radiation.

The movement 1, the character board 12, the hand 11, - - -, are arranged on an inner circumferential side of the bezel 3 through the middle frame 13 in a united state.

For example, the glass 2 is approximately formed in a disk shape from sapphire glass, heat absorbing glass, etc. having preferable thermal conductivity. A circumferential edge portion of the glass 2 is fixed to an upper end side of an inner circumference of the bezel 3.

For example, the rear cover 5 is formed by a metal such as titanium alloy, stainless steel, etc. having low thermal diffusivity and a circumferential edge portion of the rear cover 5 is fixed to a bottom face of the heat insulating drum 4. A surface of the circumferential edge portion of this rear cover 5 on its outer face (a mounting face to an arm) is coated with a heat insulating material F to prevent heat radiation.

For example, the heat conducting plate 7 is approximately formed in a disk shape by Cu, etc. having good thermal conductivity. A central portion 7c of the heat conducting plate 7 swells out toward the rear cover 5 to provide a resilient property and is formed in a shape lower by one stage than a circumferential edge portion 7d.

This heat conducting plate 7 is arranged in a state in which the circumferential edge portion 7d is fixedly attached to a lower end face 3b of the bezel 3 and the central portion 7c is fixedly attached to a side end face of the heat radiating portion 6c of the thermoelectric generator 6.

A surface of the heat conducting plate 7 except for a joining face to the side end face of the heat radiating portion 6c and a joining face to the bezel 3 is coated with a heat insulating material F to prevent heat from being radiated from the heat radiating plate 7 to the storing space 4c (described later).

For example, the bezel 3 is formed by a metal such as Cu, Al, etc. having high thermal diffusivity and a lower end side of the bezel 3 is fitted into the storing space 4c (described later) of the heat insulating drum 4. In contrast to this, an upper end side of the bezel 3 is fixed to the heat insulating drum 4 in a state projecting from an upper end of the heat insulating drum 4.

Alumite processing is performed on an upper end face of this bezel 3 to improve a heat radiating property to the outside air.

Cu plating is performed on a lower end face 3b and an inner circumferential face of the bezel 3 to improve thermal conductivity.

An air layer or a heat insulating material is arranged between an outer circumferential face of the bezel 3 and an inner circumferential face of the heat insulating drum 4 to prevent a movement of heat from the bezel 3 to the heat insulating drum 4.

For example, the heat insulating drum 4 is formed by ceramics, plastic, or a metal such as stainless steel, titanium alloy, etc. having low thermal diffusivity.

This heat insulating drum 4 is formed in a state in which the storing space (hollow portion) 4c for storing the movement 1, the bezel 3, the thermoelectric generator 6, etc. vertically extends within the heat insulating drum 4.

A heat radiating drum 9 is formed on an upper end face (inclining face) of this heat insulating drum 4.

For example, the heat radiating drum 9 is formed by a metal such as Cu, Al, etc. having a high thermal diffusive property. A heat radiating fin 9A constructed by plural irregularities for improving heat radiating efficiency is arranged on a surface of the heat radiating drum 9. The heat radiating drum 9 is engaged with the bezel 3 so as to perform thermal conductivity. Heat conducted from the heat radiating portion 6c of the thermoelectric generator 6 through the bezel 3 is efficiently radiated to the outside air through the heat radiating fin 9A.

A heat accumulating material 10A (a first heat accumulating material) accumulates thermal energy by utilizing latent heat caused by a change in phase of a substance (from a solid phase to a liquid phase). For example, the heat accumulating material 10A is constructed by the substance of a paraffin system, etc.

A melting point of the substance constituting this heat accumulating material 10A can be suitably set by a fine adjustment of components of this substance. Here, the melting point is selectively determined by setting the melting point to be lower by 5° C. than a body temperature as a high temperature portion, etc. in accordance with this body temperature. The body temperature is approximately 36 ° C. or so. However, the actual arm temperature is changed by an air temperature, a room temperature, dress or a carrying way, etc. at that time. When the air temperature is close to the body temperature, there is a case in which the actual arm temperature becomes a temperature close to 35° C. There is also a case in which the temperature of the actual arm becomes one that is equal to or lower than 20° C. in winter or a cold environment. In the present invention, paraffin having a solidifying point of 30° C. is selected as the heat accumulating material. However, it is desirable to select the heat accumulating material in conformity with a living condition of each individual. For example, the actual arm temperature becomes 35° C. in tropical and subtropical regions, and becomes 20° C. in a cold district. There is a case in which the actual arm temperature becomes a temperature that is equal to or lower than 20° C. in a very cold district and a special environment. However, it is practical to approximately select the actual arm temperature between 20° C. and 35° C. as goods of mass production.

This heat accumulating material 10A is fixedly attached to a circumferential edge portion of an inner face (a face on a side of the movement 1) of the rear cover 5. A surface of the heat accumulating material 10A except for a joining face to the rear cover 5 is coated with a heat insulating material F to prevent heat radiation to the storing space 4c.

A thermal conducting state in this wrist watch will next be explained with reference to FIG. 2.

When the wrist watch is mounted to an arm, heat (body temperature) from the arm (a high temperature portion) is conducted to a side end face of the heat receiving portion 6b of the thermoelectric generator 6 and the heat accumulating material 10A through the rear cover 5.

Here, heat emitted from the arm is easily conducted in a thickness direction of the rear cover 5 (the heat receiving portion 6b), but is not easily conducted in a plane direction of the rear cover 5 (the heat accumulating material 10A). Therefore, a large amount of heat of a central portion of the rear cover is absorbed to the heat receiving portion 6b.

Therefore, the heat receiving portion 6b is not substantially influenced by heat absorbed by the heat accumulating material 10A so that the temperature of the heat receiving portion 6b rises until a predetermined temperature (h2) is reached as shown in FIG. 2.

In contrast to this, the heat accumulating material 10A absorbs heat of the arm from an outer circumferential portion of the rear cover so that the temperature of the heat accumulating material 10A gradually rises as shown in FIG. 2. When the temperature of the heat accumulating material 10A rises until a melting point (ha), phases of the substance constituting the heat accumulating material 10A are changed from a solid phase to a liquid phase, and a quantity of heat (e.g., 40 to 80 cal/g) required in the phase change is accumulated as latent heat.

The rise in temperature of the heat accumulating material 10A is once stopped at the melting point (ha) during this phase change. When the phase change is terminated, similar to the heat receiving portion 6b, the temperature of the heat accumulating material 10A rises. However, received and radiated heats are balanced after about 30 minutes, and the temperature of the heat accumulating material 10A is stably set to a predetermined temperature (h2).

In the heat radiating portion 6c of the thermoelectric generator 6, heat is radiated to the outside air (low temperature portion) through the bezel 3, the heat radiating drum 9 and the glass 2. Received and radiated heats are balanced after about 30 minutes, and the heat radiating portion 6c is held at a predetermined temperature (h1).

Accordingly, an approximately constant temperature difference (h2−h1) is caused between the heat receiving portion 6b and the heat radiating portion 6c so that the thermoelectric generator 6 can continuously generate electric energy. These temperatures h1, h2 and a time required to balance the received and radiated heats are determined by the temperature of the outside air, the body temperature of a carrying arm, a structure and a material of the thermoelectric generating electronic device, etc.

When the wrist watch is detached from the arm, the heat radiating portion 6c and the heat receiving portion 6b of the thermoelectric generator 6 and the heat accumulating material 10A are gradually cooled by radiating heat to the outside air as shown in FIG. 2.

When the temperature of the heat accumulating material 10A falls until the above melting point (ha), the phases of the substance constituting the heat accumulating material 10A are changed (from the liquid phase to the solid phase), and the quantity of heat (e.g., 40 to 80 cal/g) accumulated as latent heat is discharged as the phases of this substance are changed. While the phases of this substance are changed, the fall in temperature of the heat receiving portion 6b is once stopped at the melting point (ha) by the discharged heat.

In the meantime, the heat radiating portion 6c is cooled. Therefore, a temperature difference is caused between the heat receiving portion 6b and the heat radiating portion 6c so that the thermoelectric generator 6 can additionally generate electric energy (s1).

Second Embodiment Mode Example

Figure 3:
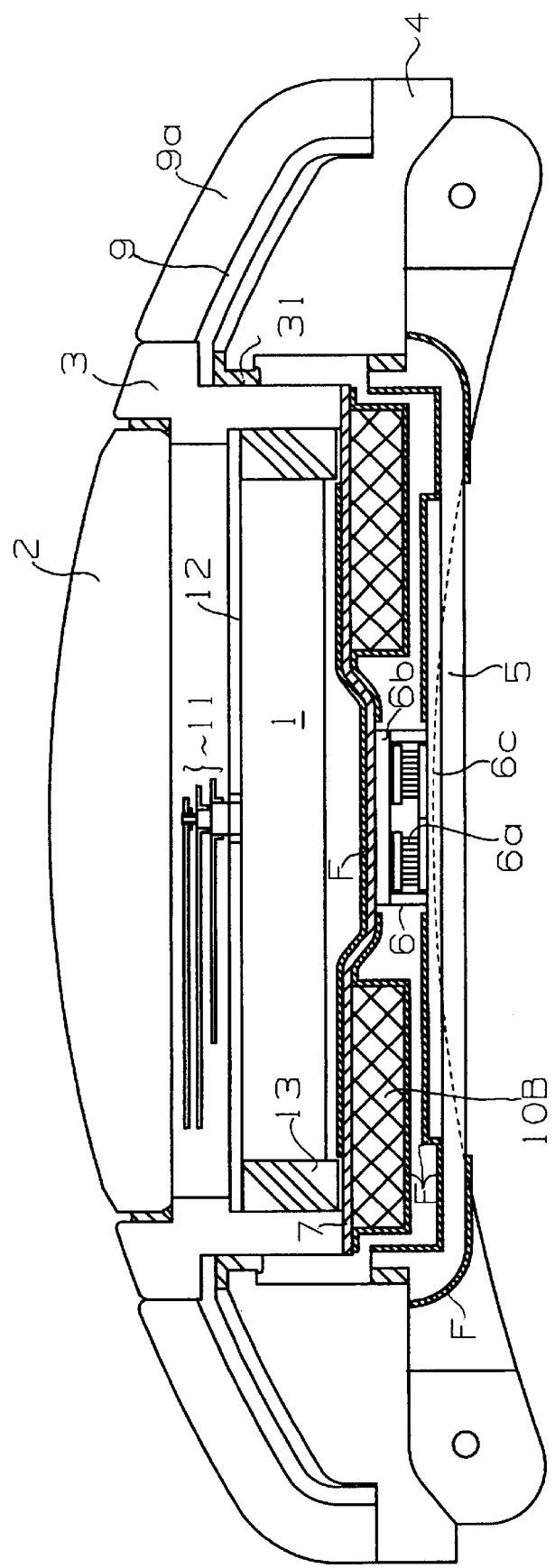
FIG. 3 is a cross-sectional view of a wrist watch illustrated as a second embodiment mode example of the thermoelectric generating electronic device in the present invention.
Figure 4:
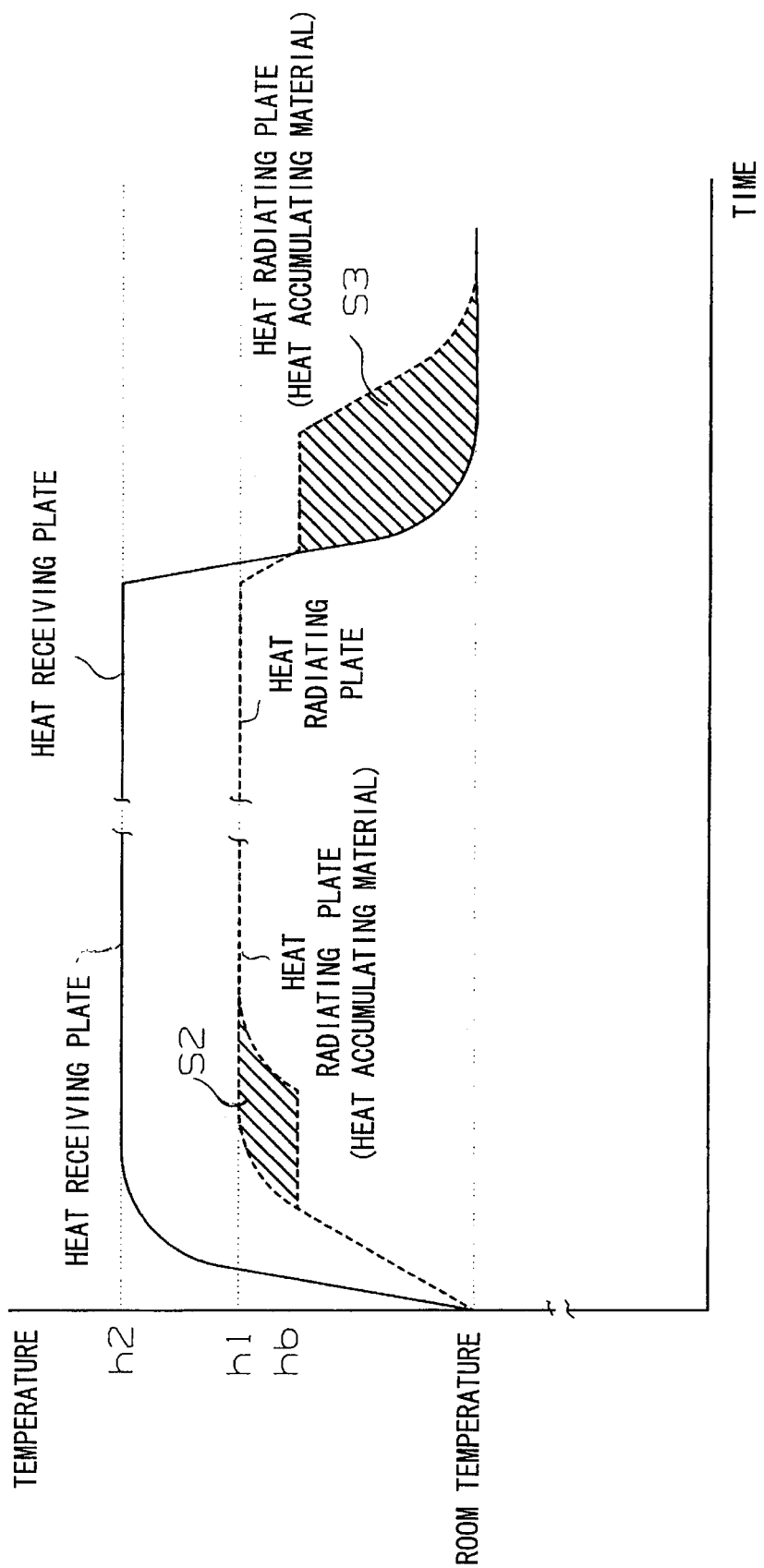
FIG. 4 is a graph showing changes in temperatures of a heat radiating portion and a heat receiving portion of a thermoelectric generator arranged in the wrist watch of FIG. 3.

FIG. 3 is a cross-sectional view of a wrist watch illustrated as a second embodiment mode example of the thermoelectric generating electronic device in the present invention. FIG. 4 is a graph showing changes in temperatures of a heat radiating portion and a heat receiving portion of a thermoelectric generator arranged in the wrist watch of FIG. 3.

In this embodiment mode, a heat accumulating material 10B is arranged on a side of the heat radiating portion 6c of the thermoelectric generator 6 as shown in FIG. 3.

In this second embodiment mode, the same portions as the above first embodiment mode are designated by the same reference numerals, and an explanation of these portions is omitted here.

In this embodiment mode, the heat accumulating material 10B (a second heat accumulating material) is fixedly attached to a face of a circumferential edge portion 7d of a heat conducting plate 7 on the side of a rear cover 5 as shown in FIG. 3.

A melting point of a substance constituting this heat accumulating material 10B can be suitably set by a fine adjustment of components of this substance. Here, the melting point is selectively determined by setting the melting point to be higher by plus 3° C. than an average temperature in a using area, etc. in accordance with this average temperature. In the present invention, 25° C. within a room in summer and 15° C in a room in winter are supposed in Japan, and a paraffin having a solidifying point of 20° C. is selected. However, it is desirable to select the heat accumulating material in conformity with a living condition in a sale area. For example, it is desirable to make the thermoelectric generating electronic device as goods while several kinds of selections such as 15° C. in a cold district, 25° C. in a subtropical region, etc. are made. When the thermoelectric generating electronic device is mainly used outdoors and is used in a special environment, there Are a case of a temperature equal to or lower than 15° C. and a case of a temperature equal to or higher than 25° C. However, it is practical to approximately select the melting point between 15° C. and 25° C. within a large majority of living rooms.

Similar to the heat accumulating material 10A, a surface of the heat accumulating material 10B except for a joining face to the heat conducting plate 7 is coated with a heat insulating material F to prevent heat from being radiated to a storing space 4c.

The heat receiving portion 6b of the thermoelectric generator 6 is formed at a size for approximately covering an entire inner face of the rear cover 5 except for the circumferential edge portion to further improve a collecting function of heat from the rear cover 5.

A thermal conducting state of this wrist watch will next be explained with reference to FIG. 4.

When the wrist watch is mounted to an arm, heat (body temperature) from the arm (a high temperature portion) is conducted to a side end face of the heat receiving portion 6b of the thermoelectric generator 6 through the rear cover 5. The temperature of the heat receiving portion 6b rises by this heat until a predetermined temperature (h2) as shown in FIG. 4.

In contrast to this, heat from the heat radiating portion 6c of the thermoelectric generator 6 is conducted to the heat accumulating material 10B through the heat conducting plate 7. This heat is absorbed to the heat accumulating material 10B so that the temperature of the heat accumulating material 10B rises.

When the temperature of the heat accumulating material 10B rises until a melting point (hb), phases of the substance constituting the heat accumulating material 10B are changed (from a solid phase to a liquid phase), and a quantity of heat (e.g., 40 to 80 cal/g) required in the phase change is accumulated as latent heat. The rises in temperatures of the heat accumulating material 10B and the heat radiating portion 6c are once stopped at the melting point (hb) temperature during this phase change.

In the meantime, the temperature of the heat receiving portion 6b rises. Therefore, a large temperature difference is caused between the heat receiving portion 6b and the he at radiating portion 6c so that electric energy (s2) can be additionally generated.

When the wrist watch is detached from the arm, the heat radiating portion 6c and the heat receiving portion 6b (rear cover 5) of the thermoelectric generator 6 are gradually cooled by radiating heat to the outside air as shown in FIG. 4.

When the temperature of the heat accumulating material 10B falls until the above melting point (hb), the phases of the substance constituting the heat accumulating material 10B are changed from the liquid phase to the solid phase, and the quantity of heat (e.g., 40 to 80 cal/g) required in the phase change is discharged as latent heat. The fall in temperature of the heat radiating portion 6c is once stopped by the discharged heat at the melting point (hb) temperature during this phase change.

In the meantime, the heat receiving portion 6b is cooled. Therefore, a minus temperature difference is caused between the heat receiving portion 6b and the heat radiating portion 6c so that the thermoelectric generator 6 generates a reverse voltage. Electric energy (s3) can be additionally obtained by inverting this reverse voltage by e.g., an electronic circuit.

Third Embodiment Mode Example

Figure 5:
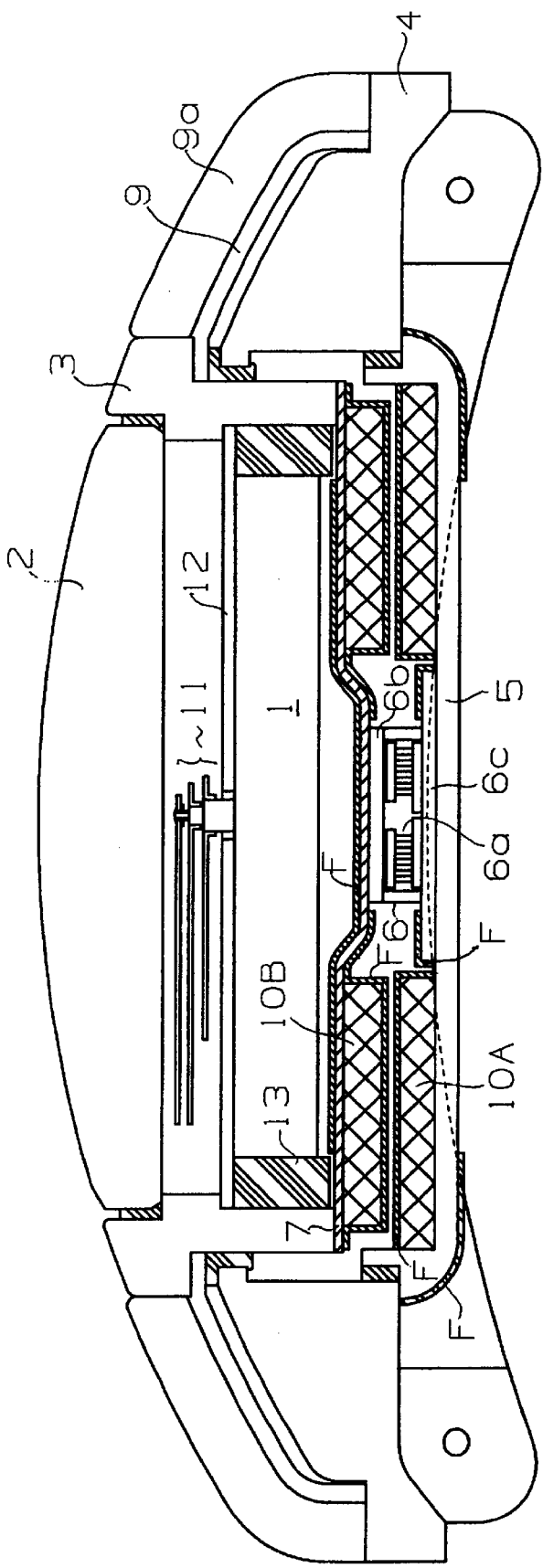
FIG. 5 is a cross-sectional view of a wrist watch illustrated as a third embodiment mode example of the thermoelectric generating electronic device in the present invention.
Figure 6:
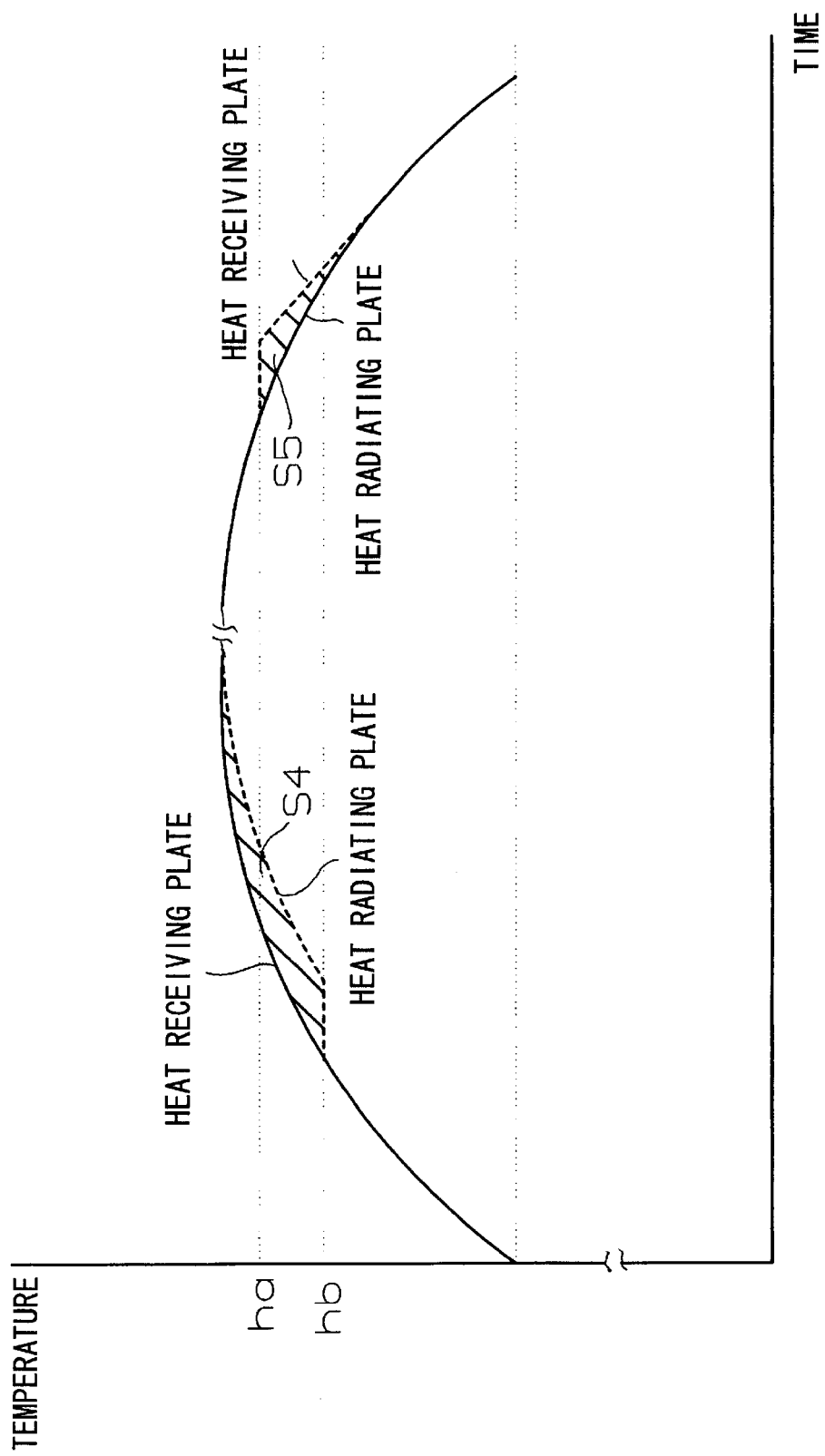
FIG. 6 is a graph showing changes in temperatures of a heat radiating portion and a heat receiving portion of a thermoelectric generator arranged in the wrist watch of FIG. 5.

FIG. 5 is a cross-sectional view of a wrist watch illustrated as a third embodiment mode example of the thermoelectric generating electronic device in the present invention. FIG. 6 is a graph showing changes in temperatures of a heat radiating portion and a heat receiving portion of a thermoelectric generator arranged in the wrist watch of FIG. 5.

In this embodiment mode, a first heat accumulating material 10A is arranged on a side of the heat receiving portion 6b of the thermoelectric generator 6, and a second heat accumulating material 10B is arranged on a side of the heat radiating portion 6c of the thermoelectric generator 6 as shown in FIG. 5.

In this third embodiment mode, the same portions as the above first and second embodiment modes are designated by the same reference numerals and an explanation of these portions is omitted here.

In this embodiment mode, the heat accumulating material 10A is fixedly attached to a circumferential edge portion of the inner face of a rear cover 5 (a face on the side of a movement 1) as shown in FIG. 5. In contrast to this, the heat accumulating material 10B is fixedly attached to a heat conducting plate 7 in a position opposed to the heat accumulating material 10A.

Surfaces of the heat accumulating materials 10A, 10B except for joining faces to the rear cover 5 and the heat conducting plate 7 are coated with a heat insulating material F to prevent heat from being radiated to a storing space 4c.

Thus, in accordance with the wrist watch in this embodiment mode, the heat accumulating materials 10A, 10B are arranged so that both effects of the wrist watches of the above first and second embodiment modes can be obtained.

Further, in accordance with the wrist watch in this embodiment mode, the thermoelectric generator 6 can generate electric energy by utilizing a change in temperature of the outside air as shown below even when no wrist watch is mounted to an arm (is left as it is).

For example, when the temperature of the outside air rises, temperatures of the heat receiving portion 6b, the heat radiating portion 6c and the heat accumulating materials 10A, 10B rise by receiving heat from the outside air as shown in FIG. 6.

When the temperature of the heat accumulating material 10B rises until a melting point (hb), the phases of a substance constituting the heat accumulating material 10B are changed from a solid phase to a liquid phase and a quantity of heat (e.g., 40 to 80 cal/g) required in the phase change is accumulated as latent heat. The rises in temperatures of the heat accumulating material 10B and the heat radiating portion 6c are once stopped at the melting point (hb) temperature during this phase change.

In the meantime, the temperature of the heat receiving portion 6b rises. Therefore, a temperature difference is caused between the heat receiving portion 6b and the heat radiating portion 6c so that electric energy (s4) can be generated. When the temperature of the outside air falls, the temperatures of the heat receiving portion 6b, the heat radiating portion 6c and the heat accumulating materials 10A, 10B fall by radiating heat to the outside air as shown in FIG. 6.

When the temperature of the heat accumulating material 10A falls until the above melting point (ha), the phases of a substance constituting the heat accumulating material 10A are changed (from a liquid phase to a solid phase) and the quantity of heat (e.g., 40 to 80 cal/g) accumulated as latent heat is discharged as this phase is changed. The fall in temperature of the heat receiving portion 6b is once stopped by the discharged heat at the melting point (ha) temperature during this phase change.

In the meantime, the heat radiating portion 6c is cooled. Therefore, a temperature difference is caused between the heat receiving portion 6b and the heat radiating portion 6c so that the thermoelectric generator 6 can generate electric energy (s5).

Fourth Embodiment Mode Example

Figure 7:
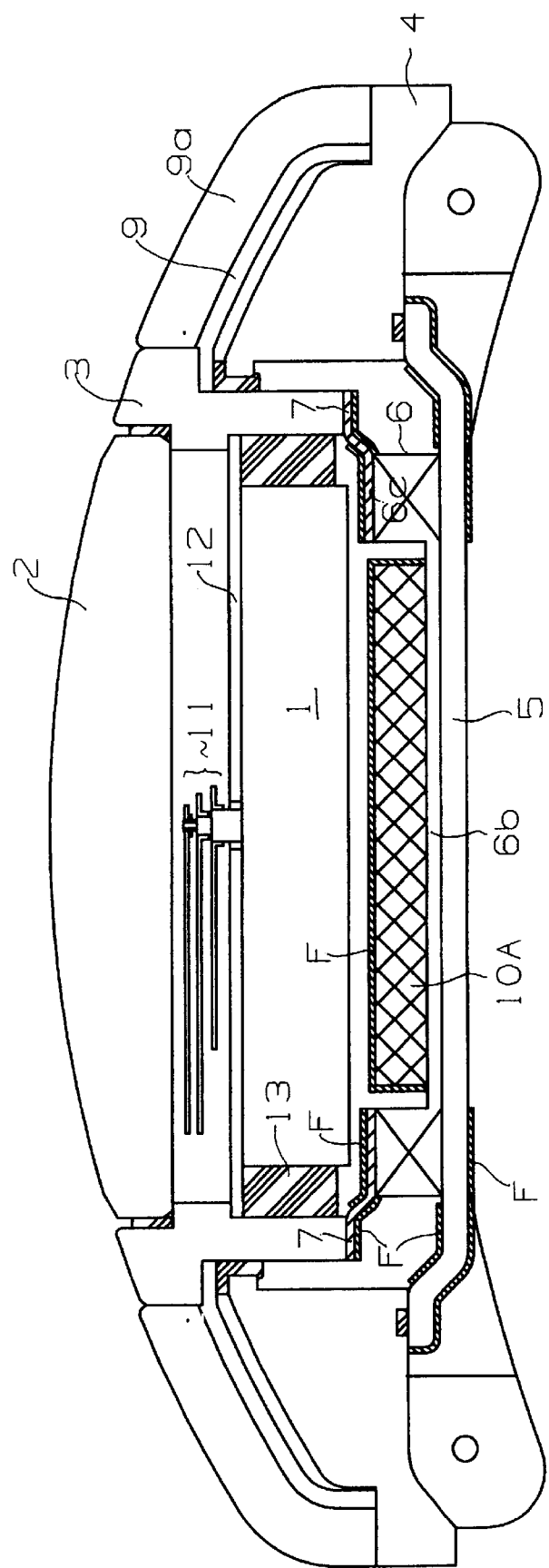
FIG. 7 is a cross-sectional view of a wrist watch illustrated as a fourth embodiment mode example of the thermoelectric generating electronic device in the present invention.

FIG. 7 is a cross-sectional view of a wrist watch illustrated as a fourth embodiment mode example of the thermoelectric generating electronic device in the present invention.

In this embodiment mode, a heat accumulating material 10A is approximately arranged at the center of a rear cover 5 as shown in FIG. 7.

In this fourth embodiment mode, the same portions as the above first embodiment mode are designated by the same reference numerals and an explanation of these portions is omitted here.

In this embodiment mode, a heat radiating portion 6c is formed in a ring shape and a heat receiving portion 6b is formed in a disk shape in a thermoelectric generator 6 as shown in FIG. 7.

In the thermoelectric generator 6, a concave space opened upward is formed and the heat accumulating material 10A is arranged within this space in a state in which the heat accumulating material 10A is fixedly attached to the heat receiving portion 6b. A face of this heat accumulating material 10A to which is expose the storing space 4c is coated with a heat insulating material F to prevent heat radiation.

A heat conducting plate 7 is arranged in a state in which one end of the heat conducting plate 7 is fixedly attached to a side end face of the heat radiating portion 6c of the thermoelectric generator 6 and the other end of the heat conducting plate 7 is fixedly attached to a lower end face 3b of a bezel 3.

A surface of the heat conducting plate 7 except for a joining face to the side end face of the heat radiating portion 6c and a joining face to the bezel 3 is coated with a heat insulating material F to prevent heat from being radiated from the heat conducting plate 7 to the storing space 4c.

Thus, effects similar to those in the above first embodiment mode can be also obtained in the construction in which the thermoelectric generator 6 and the heat accumulating material 10A are arranged.

Fifth Embodiment Mode Example

Figure 8:
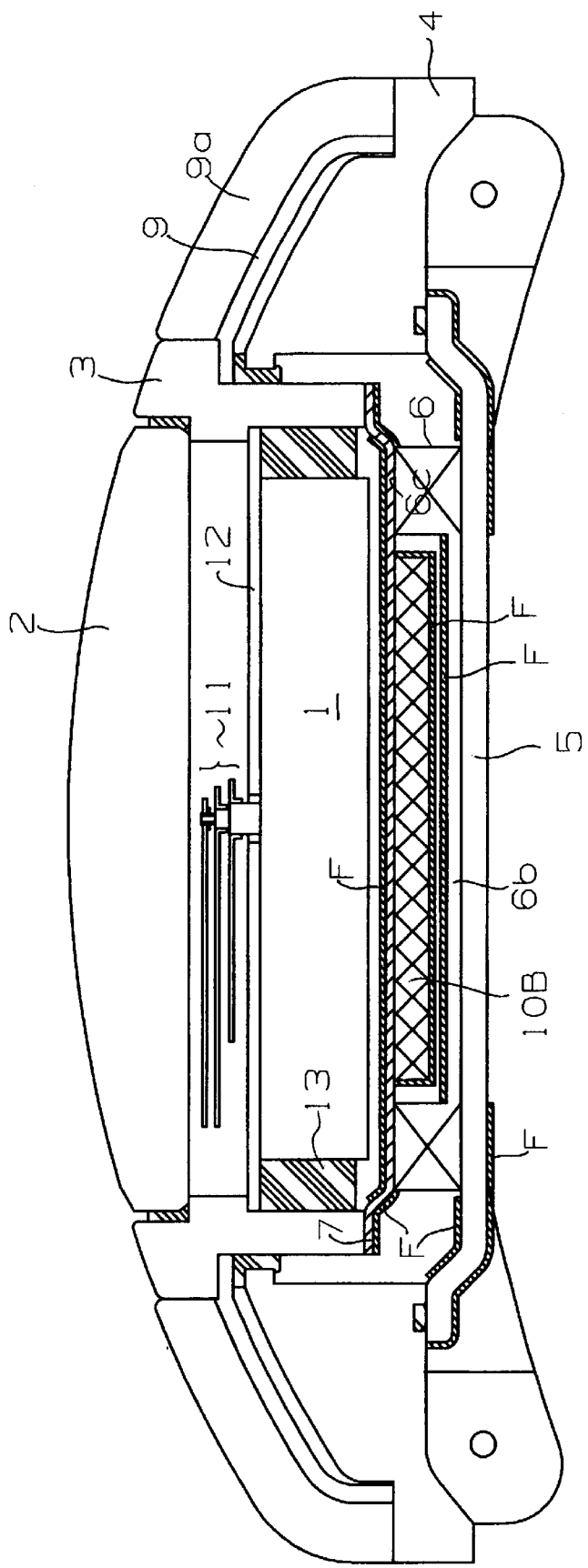
FIG. 8 is a cross-sectional view of a wrist watch illustrated as a fifth embodiment mode example of the thermoelectric generating electronic device in the present invention.

FIG. 8 is a cross-sectional view of a wrist watch illustrated as a fifth embodiment mode example of the thermoelectric generating electronic device in the present invention.

In this embodiment mode, a heat accumulating material 10B is arranged on the inner side of a thermoelectric generator 6 as shown in FIG. 8.

In this fifth embodiment mode, the same portions as the above second embodiment mode are designated by the same reference numerals and an explanation of these portions is omitted here.

In this embodiment mode, a heat radiating portion 6c is formed in a ring shape and a heat receiving portion 6b is formed in a disk shape in the thermoelectric generator 6 as shown in FIG. 8.

A heat conducting plate 7 is fixedly attached to an upper end of this thermoelectric generator 6.

The heat accumulating material 10B is arranged within a space surrounded by the heat conducting plate 7 and the thermoelectric generator 6. The heat accumulating material 10B is fixedly attached to a bottom face of the heat conducting plate 7 in a state in which the heat accumulating material 10B is thermally insulated from the heat receiving portion 6b.

Exposed faces of the heat accumulating material 10A, the heat conducting plate 7 and the thermoelectric generator 6 are respectively coated with heat insulating materials 10a, F, 7d to prevent heat radiation.

Thus, effects similar to those in the above second embodiment mode can be also obtained in the construction in which the thermoelectric generator 6 and the heat accumulating material 10B are arranged.

Sixth Embodiment Mode Example

Figure 9:
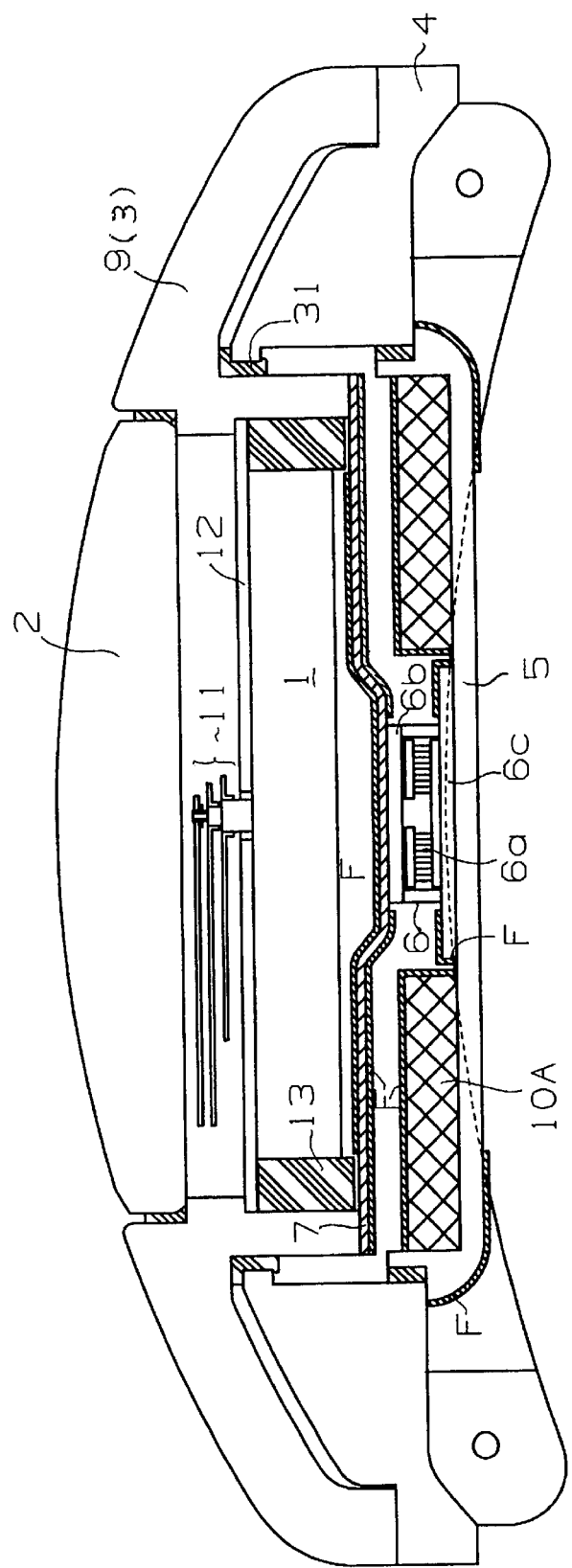
FIG. 9 is a cross-sectional view of a wrist watch illustrated as a sixth embodiment mode example of the thermoelectric generating electronic device in the present invention.

FIG. 9 is a cross-sectional view of a wrist watch illustrated as a sixth embodiment mode example of the thermoelectric generating electronic device in the present invention.

In this embodiment mode, the thermoelectric generating electronic device is constructed such that a bezel 3 and a heat radiating drum 9 are integrated with each other as shown in FIG. 9.

In this sixth embodiment mode, FIG. 9 shows an example illustrated on the basis of the above-mentioned embodiment of FIG. 1, but the same portions as FIG. 1 are designated by the same reference numerals and an explanation of these portions is omitted here. In embodiments of FIGS. 2 to 8, drawings are omitted since the bezel 3 and the heat radiating drum 9 can be integrated with each other.

In this embodiment mode, the heat radiating drum 9 is formed integrally with the bezel 3 as shown in FIG. 9. Normally, the bezel and the heat radiating drum are generally manufactured as separate bodies in view of easiness of manufacture and easiness of design finishing. However, it is desirable to integrate the bezel and the heat radiating drum with each other in view of thermal conductivity when shapes of the bezel and the heat radiating drum are easily formed and the bezel and the heat radiating drum are easily manufactured. Problems of selections of a manufacturing property and a design property are provided as developing examples of the present invention.

The present invention is not limited to the wrist watch in each of the embodiment mode examples, but can be also applied to an electronic device such as another wrist watch, a page, etc.

The detailed constructions, methods, etc. concretely shown can be changed within a range not departing from main features of the invention.

Effect of the Invention

In accordance with the present invention, the heat radiating portion of the thermoelectric generator is connected to the bezel in a heat conductible state and the heat receiving portion is connected to the rear cover in a heat conductible state. A first heat accumulating material is arranged in the above wrist watch in a state in which heat can be conducted to the heat receiving portion. Therefore, heat from an arm is conducted to the heat receiving portion of the thermoelectric generator and the first heat accumulating material through the rear cover. In contrast to this, heat from the heat radiating portion of the thermoelectric generator is radiated to the exterior through the bezel.

Accordingly, a temperature difference is caused between the heat receiving portion and the heat radiating portion of the thermoelectric generator. Thus, the thermoelectric generator can generate predetermined electric energy on the basis of this temperature difference.

Further, since the heat from the arm is conducted to the first heat accumulating material, a predetermined quantity of heat is accumulated to the first heat accumulating material.

Accordingly, for example, when the above thermoelectric generating electronic device is detached from the arm, the heat receiving portion connected to the first heat accumulating material in a heat conductible state can be held at a predetermined temperature for a constant time by the predetermined quantity of heat accumulated to the first heat accumulating material.

Namely, the electric energy can be additionally obtained by causing the temperature difference between the heat receiving portion and the heat radiating portion.

Further, for example, when a temperature of the outside air is changed from a temperature lower than the above predetermined temperature to a high temperature, or is changed from a temperature higher than the above predetermined temperature to a low temperature in a state in which the above thermoelectric generating electronic device is not mounted to the arm, the first heat accumulating material absorbs or discharges heat from the heat receiving portion so that the heat receiving portion can be held at the above predetermined temperature for a constant time. Namely, the electric energy can be obtained by causing the temperature difference between the heat receiving portion and the heat radiating portion.

In accordance with the present invention, the heat radiating portion of the thermoelectric generator is connected to the bezel in a heat conductible state and the heat receiving portion is connected to the rear cover in a heat conductible state. A second heat accumulating material is arranged in the above wrist watch in a state in which heat can be conducted to the heat radiating portion. Therefore, heat from the arm is conducted to the heat receiving portion of the thermoelectric generator through the rear cover. In contrast to this, heat from the heat radiating portion of the thermoelectric generator is conducted to the second heat accumulating material and is radiated to the exterior through the bezel.

Accordingly, a temperature difference is caused between the heat receiving portion and the heat radiating portion of the thermoelectric generator so that the thermoelectric generator can generate predetermined electric energy on the basis of this temperature difference.

Further, since the heat from the heat radiating portion of the thermoelectric generator is conducted to the second heat accumulating material, a predetermined quantity of heat is accumulated to the second heat accumulating material.

Accordingly, for example, the predetermined quantity of heat is absorbed to the second heat accumulating material for some time after the above thermoelectric generating electronic device is mounted to the arm. Therefore, the heat radiating portion connected to the second heat accumulating material in a heat conductible state can be held at a predetermined temperature for a constant time. Namely, the temperature difference between the heat receiving portion and the heat radiating portion is enlarged so that more electric energy can be obtained.

Further, for example, after the above thermoelectric generating electronic device is detached from the arm, the heat radiating portion connected to the second heat accumulating material in a heat conductible state can be held at a predetermined temperature for a constant time by the predetermined quantity of heat accumulated to the second heat accumulating material. Namely, a minus temperature difference is caused between the heat receiving portion and the heat radiating portion so that electric energy can be obtained.

Further, for example, when a temperature of the outside air is changed from a temperature lower than the above predetermined temperature to a high temperature, or is changed from a temperature higher than the above predetermined temperature to a low temperature in a state in which the above thermoelectric generating electronic device is not mounted to the arm, the second heat accumulating material absorbs or discharges heat from the heat radiating portion so that the heat radiating portion can be held at the above predetermined temperature for a constant time. Namely, the electric energy can be obtained by causing the temperature difference between the heat receiving portion and the heat radiating portion.

Thus, in accordance with the present invention, the heat radiating portion of the thermoelectric generator is connected to the bezel in a heat conductible state and the heat receiving portion is connected to the rear cover in a heat conductible state. The heat accumulating material is arranged in the above wrist watch in a state in which heat can be conducted to the heat receiving portion or the heat radiating portion. Therefore, heat from the arm is effectively accumulated to the heat accumulating material and is supplied after a time difference so that more energy can be additionally generated.

Namely, similar to a case in which there is no heat accumulating material, the temperature difference is caused between the heat receiving portion and the heat radiating portion of the thermoelectric generator while the thermoelectric generating electronic device is mounted to the arm. The thermoelectric generator can generate predetermined electric energy on the basis of this temperature difference. When there is no heat accumulating material, no heat is supplied when the thermoelectric generating electronic device is detached from the arm. Accordingly, electricity generation is stopped after about one to two minutes.

However, in the present invention, when the above thermoelectric generating electronic device is detached from the arm, the heat receiving portion connected to the heat accumulating material in a heat conductible state can be held at a predetermined temperature for a constant time by the predetermined quantity of heat accumulated to the heat accumulating material. Namely, the temperature difference is caused between the heat receiving portion and the heat radiating portion by extending the heat supply for a constant time even when no heat from the arm is supplied. Thus, the electric energy can be additionally generated.

In the case of a solar battery and a thermoelectric generating electronic device for generating electricity or winding-up a spring by utilizing kinetic energy as well as the thermoelectric generation, there is no supply of energy and a function of the thermoelectric generating electronic device is stopped when the thermoelectric generating electronic device is stored to a drawer, etc. for a long period in a state in which no thermoelectric generating electronic device is mounted to the arm. However, in accordance with the present invention, when the temperature of the outside air is changed from a temperature lower than the above predetermined temperature to a high temperature, or is changed from a temperature higher than the above predetermined temperature to a low temperature in a state in which the above thermoelectric generating electronic device is not mounted to the arm, the heat accumulating material absorbs or discharges heat from the heat receiving portion so that the heat receiving portion can be held at the above predetermined temperature for a constant time. Namely, the electric energy can be obtained by causing the temperature difference between the heat receiving portion and the heat radiating portion.

What is claimed is:

1. A thermoelectric generating electronic device comprising: a heat insulating drum for restraining heat conduction and having a hollow portion extending in a vertical direction of the heat insulating drum; a rear cover for covering a lower end side of the hollow portion; a glass arranged on an upper end side of the hollow portion; a bezel connected to the heat insulating drum for supporting the glass; a heat radiating drum thermally connected with the bezel; a thermoelectric generator having a heat receiving portion and a heat radiating portion for generating predetermined electric energy in accordance with a temperature difference between the heat receiving portion and the heat radiating portion, the heat radiating portion being thermally connected to the bezel and the heat receiving portion being thermally connected to the rear cover; and a heat accumulating material disposed generally parallel to the thermoelectric generator for accumulating heat and disposed in the hollow portion of the heat insulating drum so that heat is conducted to the heat receiving portion of the thermoelectric generator.

2. A thermoelectric generating electronic device as claimed in claim 1, wherein the rear cover comprises a thin plate; and wherein the heat accumulating material is fixedly attached to an edge portion of the thin plate.

3. A thermoelectric generating electronic device as claimed in claim 1, further comprising a heat conducting plate for connecting the heat radiating portion of the thermoelectric generator to the bezel; and wherein the rear cover comprises a thin plate and has a lower thermal conductivity than that of the heat conducting plate.

4. A thermoelectric generating electronic device as claimed in claim 1; wherein the heat radiating drum and the bezel are formed integrally in one piece.

5. A thermoelectric generating electronic device comprising: a heat insulating drum for restraining heat conduction and having a hollow portion extending in a vertical direction of the heat insulating drum; a rear cover for covering a lower end side of the hollow portion; a glass arranged on an upper end side of the hollow portion; a bezel connected to the heat insulating drum for supporting the glass; a heat radiating drum thermally connected with the bezel; a thermoelectric generator having a heat receiving portion and a heat radiating portion for generating predetermined electric energy in accordance with a temperature difference between the heat receiving portion and the heat radiating portion, the heat radiating portion being thermally connected to the bezel and the heat receiving portion being thermally connected to the rear cover; and a heat accumulating material disposed generally parallel to the thermoelectric generator for accumulating heat and disposed. in the hollow portion of the heat insulating drum so that heat is conducted to the heat radiating portion of the thermoelectric generator.

6. A thermoelectric generating electronic device as claimed in claim 5; further comprising a heat conducting plate for connecting the heat radiating portion of the thermoelectric generator to the bezel; and wherein the heat accumulating material is fixedly attached to the heat conducting plate.

7. A thermoelectric generating electronic device comprising: a heat insulating drum for restraining heat conduction and having a hollow portion extending in a vertical direction of the heat insulating drum; a rear cover for covering a lower end side of the hollow portion; a glass arranged on an upper end side of the hollow portion; a bezel connected to the heat insulating drum for supporting the glass; a heat radiating drum thermally connected with the bezel; a thermoelectric generator having a heat receiving portion and a heat radiating portion for generating predetermined electric energy in accordance with a temperature difference between the heat receiving portion and the heat radiating portion, the heat radiating portion being thermally connected to the bezel and the heat receiving portion being thermally connected to the rear cover; and a heat accumulating material for accumulating heat and disposed in the hollow portion of the heat insulating drum so that heat is conducted to the heat receiving portion of the thermoelectric generator, the heat accumulating material comprising a substance having a transformation point at which the substance changes from a solid phase to a liquid phase at a temperature in the range of 20° C. to 35° C.

8. A thermoelectric generating electronic device comprising: a heat insulating drum for restraining heat conduction and having a hollow portion extending in a vertical direction of the heat insulating drum; a rear cover for covering a lower end side of the hollow portion; a glass arranged on an upper end side of the hollow portion; a bezel connected to the heat insulating drum for supporting the glass; a heat radiating drum thermally connected with the bezel; a thermoelectric generator having a heat receiving portion and a heat radiating portion for generating predetermined electric energy in accordance with a temperature difference between the heat receiving portion and the heat radiating portion, the heat radiating portion being thermally connected to the bezel and the heat receiving portion being thermally connected to the rear cover; and a heat accumulating material for accumulating heat and disposed in the hollow portion of the heat insulating drum so that heat is conducted to the heat radiating portion of the thermoelectric generator, the heat accumulating material comprising a substance having a transformation point at which the substance changes from a solid phase to a liquid phase at a temperature in the range of 15° C. to 25° C.

9. A thermoelectric generating electronic device comprising: a heat insulating drum for restraining heat conduction and having a hollow portion extending in a vertical direction of the heat insulating drum; a rear cover for covering a lower end side of the hollow portion; a glass arranged on an upper end side of the hollow portion; a bezel connected to the heat insulating drum for supporting the glass; a heat radiating drum thermally connected with the bezel; a thermoelectric generator having a heat receiving portion and a heat radiating portion for generating predetermined electric energy in accordance with a temperature difference between the heat receiving portion and the heat radiating portion, the heat radiating portion being thermally connected to the bezel and the heat receiving portion being thermally connected to the rear cover; a first heat accumulating material for accumulating heat and disposed in the hollow portion of the heat insulating drum so that heat is conducted to the heat receiving portion of the thermoelectric generator; and a second heat accumulating material for accumulating heat and disposed in the hollow portion of the heat insulating drum so that heat is conducted to the heat radiating portion of the thermoelectric generator, a transformation point temperature at which the second heat accumulating material changes from a solid phase to a liquid phase being higher than that of the first heat accumulating material.

10. A thermoelectric generating electronic device as claimed in claim 9; wherein the solidifying points of the first and second heat accumulating materials are selectively set by a temperature of the outside air in the environment in which the thermelectric generating electronic device is used.

11. A thermoelectric generating electronic device comprising: a casing comprised of a heat insulating frame portion having a hollow space, a cover member for covering a lower end of the hollow space, a transparent member disposed over an upper end of the hollow space, a bezel connected to the frame portion for supporting the transparent member, and a heat radiating frame portion thermally connected with the bezel; a thermoelectric generator having a heat receiving portion and a heat radiating portion for generating electric energy in accordance with a temperature difference between the heat receiving portion and the heat radiating portion, the heat radiating portion being thermally connected to the bezel and the heat receiving portion being thermally connected to the cover member; and a heat accumulating material disposed generally parallel to the thermoelectric generator for accumulating heat and disposed in the hollow space of the heat insulating frame so that heat is conducted to the heat receiving portion of the thermoelectric generator during generation of electric energy.

12. A thermoelectric generating electronic device according to claim 11; wherein the heat accumulating material. comprises a first heat accumulating material; and further comprising a second heat accumulating material for accumulating heat and disposed in the hollow space of the heat insulating frame so that heat is conducted to the heat radiating portion of the thermoelectric generator.

13. A thermoelectric generating electronic device as claimed in claim 11; further comprising a heat conducting member for connecting the heat radiating portion of the thermoelectric generator to the bezel; and wherein the second heat accumulating material is fixedly attached to the heat conducting plate.

14. A thermoelectric generating electronic device as claimed in claim 11; wherein the cover member comprises a thin plate; and wherein the heat accumulating material is fixedly attached to an edge portion of the thin plate.

15. A thermoelectric generating electronic device as claimed in claim 11; further comprising a heat conducting plate for connecting the heat radiating portion of the thermoelectric generator to the bezel; and wherein the cover member comprises a thin plate and has a lower thermal conductivity than that of the heat conducting plate.

16. A thermoelectric generating electronic device as claimed in claim 11; wherein the heat radiating frame portion and the bezel of the casing are formed integrally in one piece.

17. A thermoelectric generating electronic device comprising: a casing comprised of a heat insulating frame portion having a hollow space, a cover member for covering a lower end of the hollow space, a transparent member disposed over an upper end of the hollow space, a bezel connected to the frame portion for supporting the transparent member, and a heat radiating frame portion thermally connected with the bezel; a thermoelectric generator having a heat receiving portion and a heat radiating portion for generating electric energy in accordance with a temperature difference between the heat receiving portion and the heat radiating portion, the heat radiating portion being thermally connected to the bezel and the heat receiving portion being thermally connected to the cover member; a first heat accumulating material for accumulating heat and disposed in the hollow space of the heat insulating frame so that heat is conducted to the heat receiving portion of the thermoelectric generator during generation of electric energy; a second heat accumulating material for accumulating heat and disposed in the hollow space of the heat insulating frame so that heat is conducted to the heat radiating portion of the thermoelectric generator, the second heat accumulating material comprising a substance having a transformation point at which the substance changes from a solid phase to a liquid phase at a temperature in the range of 15° C. to 25° C.

18. A thermoelectric generating electronic device comprising: a casing comprised of a heat insulating frame portion having a hollow space, a cover member for covering a lower end of the hollow space, a transparent member disposed over an upper end of the hollow space, a bezel connected to the frame portion for supporting the transparent member, and a heat radiating frame portion thermally connected with the bezel; a thermoelectric generator having a heat receiving portion and a heat radiating portion for generating electric energy in accordance with a temperature difference between the heat receiving portion and the heat radiating portion, the heat radiating portion being thermally connected to the bezel and the heat receiving portion being thermally connected to the cover member; and a heat accumulating material for accumulating heat and disposed in the hollow space of the heat insulating frame so that heat is conducted to the heat receiving portion of the thermoelectric generator during generation of electric energy, the heat accumulating material comprising a substance having a transformation point at which the substance changes from a solid phase to a liquid phase at a temperature in the range of 20° C. to 35° C.

* * * * *